(12) United States Patent
Berman et al.

(10) Patent No.: US 9,613,664 B2
(45) Date of Patent: Apr. 4, 2017

(54) METHOD OF OPERATING MEMORY DEVICE INCLUDING MULTI-LEVEL MEMORY CELLS

(71) Applicant: SAMSUNG ELECTRONICS CO., LTD., Suwon-si, Gyeonggi-do (KR)

(72) Inventors: Amit Berman, Ramat Gan (IL); Uri Beitler, Ramat Gan (IL); Jun Jin Kong, Gyeonggi-do (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 29 days.

(21) Appl. No.: 14/600,754

(22) Filed: Jan. 20, 2015

(65) Prior Publication Data

US 2016/0211028 A1    Jul. 21, 2016

(51) Int. Cl.
*H03M 13/00* (2006.01)
*G11C 7/10* (2006.01)
*G11C 16/04* (2006.01)
*G11C 16/10* (2006.01)

(52) U.S. Cl.
CPC ........ *G11C 7/1006* (2013.01); *G11C 16/0483* (2013.01); *G11C 16/10* (2013.01); *G11C 2207/102* (2013.01)

(58) Field of Classification Search
None
See application file for complete search history.

(56) References Cited

U.S. PATENT DOCUMENTS

| 7,164,601 | B2 * | 1/2007 | Mitani | G11C 11/56 365/185.03 |
| 7,697,325 | B2 | 4/2010 | Sprouse et al. | |
| 7,844,879 | B2 * | 11/2010 | Ramamoorthy | G06F 11/1068 365/185.09 |
| 8,014,196 | B2 | 9/2011 | Graef | |
| 8,499,215 | B2 | 7/2013 | Kong et al. | |
| 2009/0276687 | A1 * | 11/2009 | Kim | G06F 11/1072 714/777 |
| 2010/0057977 | A1 * | 3/2010 | Graef | G11C 7/1006 711/103 |
| 2011/0090734 | A1 * | 4/2011 | Burger, Jr. | G06F 11/1072 365/185.03 |
| 2011/0216586 | A1 * | 9/2011 | Graef | G11C 7/02 365/185.02 |

(Continued)

FOREIGN PATENT DOCUMENTS

JP    2007-157234    6/2007
KR    1020070109251    11/2007

*Primary Examiner* — Daniel McMahon
(74) *Attorney, Agent, or Firm* — F. Chau & Associates, LLC

(57) ABSTRACT

A method of operating a memory device is provided. The memory device includes a plurality of multi-level memory cells of which each memory cell includes L levels. Data which is expressed in a binary number is received. A P-length string is generated from the data. The P-length string is converted to a Q-length string. The Q-length string is distributed using I levels by eliminating at least one level from the L levels. P and Q represent binary bit lengths of the P-length string and the Q-length string. Q is greater than P. L represents a maximum number of levels which each multi-level memory cell has. I is smaller than L. The Q-length string is programmed into the plurality of memory cells.

9 Claims, 13 Drawing Sheets

(56) References Cited

U.S. PATENT DOCUMENTS

| | | |
|---|---|---|
| 2013/0067140 A1 | 3/2013 | Bisen et al. |
| 2013/0290813 A1 | 10/2013 | Ramamoorthy et al. |
| 2014/0059406 A1* | 2/2014 | Hyun .................. G11C 11/5621 |
| | | 714/773 |

* cited by examiner

FIG. 5

| DATA | E_DATA |
|---|---|
| Input Data | Encoded Input Data |
| 00 | 000 |
| 01 | 001 |
| 02 | 002 |
| 03 | 003 |
| 04 | 010 |
| 05 | 011 |
| 06 | 012 |
| 07 | 013 |
| 10 | 020 |
| 11 | 021 |
| 12 | 022 |
| 13 | 023 |
| 14 | 030 |
| 15 | 031 |
| 16 | 032 |
| 17 | 033 |
| ⋮ | ⋮ |
| 67 | 313 |
| 70 | 320 |
| 71 | 321 |
| 72 | 322 |
| 73 | 323 |
| 74 | 330 |
| 75 | 331 |
| 76 | 332 |
| 77 | 333 |

Entry B (74 / 330)

FIG. 8

| DATA | | E_DATA | | |
|---|---|---|---|---|
| Page-1 | Page-2 | Cells | Ref-1 | Ref-2 |
| 000 | 000 | 1110 | +++0 | ---- |
| 000 | 001 | 2220 | +++0 | 222- |
| 000 | 010 | 1120 | +++0 | --2- |
| 000 | 011 | 2210 | +++0 | 22-- |
| 000 | 100 | 1210 | +++0 | -2-- |
| 000 | 101 | 2120 | +++0 | 2-2- |
| 000 | 110 | 2110 | +++0 | 2--- |
| 000 | 111 | 1220 | +++0 | -22- |
| 001 | 000 | 1101 | ++0+ | ---- |
| 001 | 001 | 1102 | ++0+ | ---2 |
| 001 | 010 | 2202 | ++0+ | 22-2 |
| 001 | 011 | 2201 | ++0+ | 22-- |
| 001 | 100 | 1201 | ++0+ | -2-- |
| 001 | 101 | 1202 | ++0+ | -2-2 |
| 001 | 110 | 2101 | ++0+ | 2--- |
| 001 | 111 | 2102 | ++0+ | 2--2 |
| 010 | 000 | 1011 | +0++ | ---- |
| 010 | 001 | 1012 | +0++ | ---2 |
| 010 | 010 | 1021 | +0++ | --2- |
| 010 | 011 | 1022 | +0++ | --22 |
| 010 | 100 | 2022 | +0++ | 2-22 |
| 010 | 101 | 2021 | +0++ | 2-2- |
| 010 | 110 | 2011 | +0++ | 2--- |
| 010 | 111 | 2012 | +0++ | 2--2 |
| 011 | 000 | 0111 | 0+++ | ---- |
| 011 | 001 | 0112 | 0+++ | ---2 |
| 011 | 010 | 0121 | 0+++ | --2- |
| 011 | 011 | 0122 | 0+++ | --22 |
| 011 | 100 | 0211 | 0+++ | -2-- |
| 011 | 101 | 0212 | 0+++ | -2-2 |
| 011 | 110 | 0222 | 0+++ | -222 |
| 011 | 111 | 0221 | 0+++ | -22- |

| DATA | | E_DATA | | |
|---|---|---|---|---|
| Page-1 | Page-2 | Cells | Ref-1 | Ref-2 |
| 100 | 000 | 1111 | ++++ | ---- |
| 100 | 001 | 1112 | ++++ | ---2 |
| 100 | 010 | 1121 | ++++ | --2- |
| 100 | 011 | 1122 | ++++ | --22 |
| 100 | 100 | 1211 | ++++ | -2-- |
| 100 | 101 | 1212 | ++++ | -2-2 |
| 100 | 110 | 1222 | ++++ | -222 |
| 100 | 111 | 1221 | ++++ | -22- |
| 101 | 000 | 1001 | +00+ | ---- |
| 101 | 001 | 1002 | +00+ | ---2 |
| 101 | 010 | 1020 | +0+0 | --2- |
| 101 | 011 | 2200 | ++00 | 22-- |
| 101 | 100 | 1200 | ++00 | -2-- |
| 101 | 101 | 2020 | +0+0 | 2-2- |
| 101 | 110 | 2001 | +00+ | 2--- |
| 101 | 111 | 2002 | +00+ | 2--2 |
| 110 | 000 | 0011 | 00++ | ---- |
| 110 | 001 | 0012 | 00++ | ---2 |
| 110 | 010 | 0021 | 00++ | --2- |
| 110 | 011 | 0022 | 00++ | --22 |
| 110 | 100 | 0201 | 0+0+ | -2-- |
| 110 | 101 | 0202 | 0+0+ | -2-2 |
| 110 | 110 | 0110 | 0++0 | ---- |
| 110 | 111 | 0220 | 0++0 | -22- |
| 111 | 000 | 0001 | 000+ | ---- |
| 111 | 001 | 0002 | 000+ | ---2 |
| 111 | 010 | 0020 | 00+0 | --2- |
| 111 | 011 | 0010 | 00+0 | ---- |
| 111 | 100 | 0200 | 0+00 | -2-- |
| 111 | 101 | 0100 | 0+00 | ---- |
| 111 | 110 | 2000 | +000 | 2--- |
| 111 | 111 | 1000 | +000 | ---- |

FIG. 13

| Page-1 Data [bits] | Page-2 Data [bits] | E_DATA1 1st Page Encode [Cells] | E_DATA2 1st+2nd Pages Encode [Cells] | Read with Ref 0/1 | Page-1 Data [bits] | Page-2 Data [bits] | E_DATA1 1st Page Encode [Cells] | E_DATA2 1st+2nd Pages Encode [Cells] | Read with Ref 0/1 |
|---|---|---|---|---|---|---|---|---|---|
| 000 | 000 | 0000 | 0001 | 000+ | 100 | 000 | 1000 | 1100 | ++00 |
| 000 | 001 | 0000 | 0002 | 000+ | 100 | 001 | 1000 | 1200 | ++00 |
| 000 | 010 | 0000 | 0010 | 00+0 | 100 | 010 | 1000 | 2100 | ++00 |
| 000 | 011 | 0000 | 0020 | 00+0 | 100 | 011 | 1000 | 2200 | ++00 |
| 000 | 100 | 0000 | 0100 | 0+00 | 100 | 100 | 1000 | 1001 | +00+ |
| 000 | 101 | 0000 | 0200 | 0+00 | 100 | 101 | 1000 | 1002 | +00+ |
| 000 | 110 | 0000 | 1000 | +000 | 100 | 110 | 1000 | 2001 | +00+ |
| 000 | 111 | 0000 | 2000 | +000 | 100 | 111 | 1000 | 2002 | +00+ |
| 001 | 000 | 0010 | 0011 | 00++ | 101 | 000 | 1010 | 1011 | +0++ |
| 001 | 001 | 0010 | 0012 | 00++ | 101 | 001 | 1010 | 1012 | +0++ |
| 001 | 010 | 0010 | 0021 | 00++ | 101 | 010 | 1010 | 1021 | +0++ |
| 001 | 011 | 0010 | 0022 | 00++ | 101 | 011 | 1010 | 1022 | +0++ |
| 001 | 100 | 0010 | 0120 | 0++0 | 101 | 100 | 1010 | 2022 | +0++ |
| 001 | 101 | 0010 | 0210 | 0++0 | 101 | 101 | 1010 | 2021 | +0++ |
| 001 | 110 | 0010 | 0110 | 0++0 | 101 | 110 | 1010 | 2011 | +0++ |
| 001 | 111 | 0010 | 0220 | 0++0 | 101 | 111 | 1010 | 2012 | +0++ |
| 010 | 000 | 0100 | 1111 | ++++ | 110 | 000 | 1100 | 1101 | ++0+ |
| 010 | 001 | 0100 | 1112 | ++++ | 110 | 001 | 1100 | 1102 | ++0+ |
| 010 | 010 | 0100 | 1121 | ++++ | 110 | 010 | 1100 | 2202 | ++0+ |
| 010 | 011 | 0100 | 1122 | ++++ | 110 | 011 | 1100 | 2201 | ++0+ |
| 010 | 100 | 0100 | 1211 | ++++ | 110 | 100 | 1100 | 1201 | ++0+ |
| 010 | 101 | 0100 | 1212 | ++++ | 110 | 101 | 1100 | 1202 | ++0+ |
| 010 | 110 | 0100 | 1222 | ++++ | 110 | 110 | 1100 | 2101 | ++0+ |
| 010 | 111 | 0100 | 1221 | ++++ | 110 | 111 | 1100 | 2102 | ++0+ |
| 011 | 000 | 0110 | 0111 | 0+++ | 111 | 000 | 1110 | 1110 | +++0 |
| 011 | 001 | 0110 | 0112 | 0+++ | 111 | 001 | 1110 | 2220 | +++0 |
| 011 | 010 | 0110 | 0121 | 0+++ | 111 | 010 | 1110 | 1120 | +++0 |
| 011 | 011 | 0110 | 0122 | 0+++ | 111 | 011 | 1110 | 2210 | +++0 |
| 011 | 100 | 0110 | 0211 | 0+++ | 111 | 100 | 1110 | 1210 | +++0 |
| 011 | 101 | 0110 | 0212 | 0+++ | 111 | 101 | 1110 | 2120 | +++0 |
| 011 | 110 | 0110 | 0222 | 0+++ | 111 | 110 | 1110 | 2110 | +++0 |
| 011 | 111 | 0110 | 0221 | 0+++ | 111 | 111 | 1110 | 1220 | +++0 | row A: 001 000 0010 0011 00++
row B: 011 010 0110 0121 0+++
row C: 110 010 1100 2202 ++0+

METHOD OF OPERATING MEMORY DEVICE INCLUDING MULTI-LEVEL MEMORY CELLS

TECHNICAL FIELD

The present inventive concept relates to a method of operating a memory device and a memory controller for operating the memory device.

DISCUSSION OF RELATED ART

As the number of levels per a memory cell in a nonvolatile memory increases, program and read operations suffer from increased latencies. Program and verify pulses are controlled such that accurate charge tunneling occurs. The number of required reference comparisons for reading data from a memory cell is increased linearly with the number of levels. Such fine control of program and verify pulses, and linear increase in the comparison number cause increases in latency, power consumption and operation time.

SUMMARY OF THE INVENTION

According to an exemplary embodiment of the present inventive concept, a method of operating a memory device is provided. The memory device includes a plurality of multi-level memory cells of which each memory cell includes L levels. Data which is expressed in a binary number is received. A P-length string is generated from the data. The P-length string is converted to a Q-length string. The Q-length string is distributed using I levels by eliminating at least one level from the L levels. P and Q represent binary bit lengths of the P-length string and the Q-length string. Q is greater than P. L represents a maximum number of levels which each multi-level memory cell has. I is smaller than L. The Q-length string is programmed into the plurality of memory cells.

According to an exemplary embodiment of the present inventive concept, a method of programming a memory device is provided. The memory device includes a plurality of multi-level memory cells. A P-length string expressed in a binary number is received. The P-length string is encoded to a first number expressed in base $2^m$ (L). Each multi-level memory cell includes L levels, and m is equal to or greater than 2. The first number is converted to a Q-length string. The Q-length string is expressed in a second number expressed in base I. L is greater than I. Q is greater than P. P and Q represent binary bit lengths of the P-length string and the Q-length string. The Q-length string is programmed into Q/m memory cells of the plurality of multi-level memory cells. The Q-length string is distributed over Q/m memory cells using I levels of each memory cell.

According to an exemplary embodiment of the present inventive concept, a memory controller for operating a nonvolatile memory device is provided. The nonvolatile memory device includes a plurality of multi-level memory cells of which each memory cell includes L levels. The memory controller includes a level reduction encoder and a level reduction decoder. The level reduction encoder converts a P-length string to a Q-length string by eliminating at least one level from the L levels. The P-length is expressed in a number of base L. The Q-length is expressed in a number of base I. P and Q represent binary bit lengths of the P-length string and the Q-length string. Q is greater than P. L represents a maximum number of levels which each multi-level memory cell has. I is smaller than L. The level reduction decoder decodes the Q-length string to the P-length string.

BRIEF DESCRIPTION OF THE DRAWINGS

These and other features of the present invention will become more apparent by describing in detail exemplary embodiments thereof with reference to the accompanying drawings of which:

FIGS. 4 and 5 show tables which include a plurality of entries mapping input data to encoded input data according to an exemplary tabular encoding method of the present inventive concept;

FIG. 8 shows a level reduction table showing a single reference comparison for a read operation according to an exemplary embodiment of the present inventive concept;

FIG. 13 shows a table showing an exemplary one-to-one mapping relationship for an MLC which stores multiple pages in a page-by-page manner using higher levels according to an exemplary embodiment of the present inventive concept.

DETAILED DESCRIPTION OF EXEMPLARY EMBODIMENTS

Figure 1:
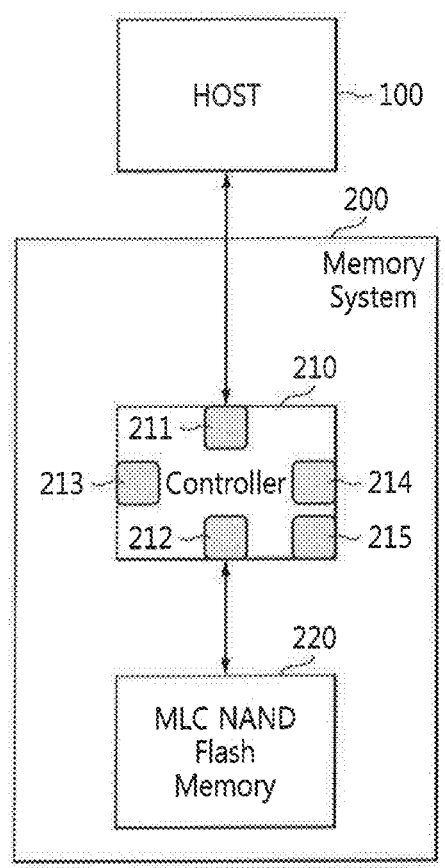
FIG. 1 shows a memory system according to an exemplary embodiment of the present inventive concept.

Exemplary embodiments of the present invention will be described below in detail with reference to the accompanying drawings. However, the present invention may be embodied in different forms and should not be construed as limited to the embodiments set forth herein. In the drawings, the thickness of layers and regions may be exaggerated for clarity. It will also be understood that when an element is referred to as being "on" another element or substrate, it may be directly on the other element or substrate, or intervening layers may also be present, it will also be understood that when an element is referred to as being "coupled to or connected to" another element, it may be directly coupled to or connected to the other element, or intervening elements may also be present. Like reference numerals may refer to the like elements throughout the specification and drawings.

Figure 2:
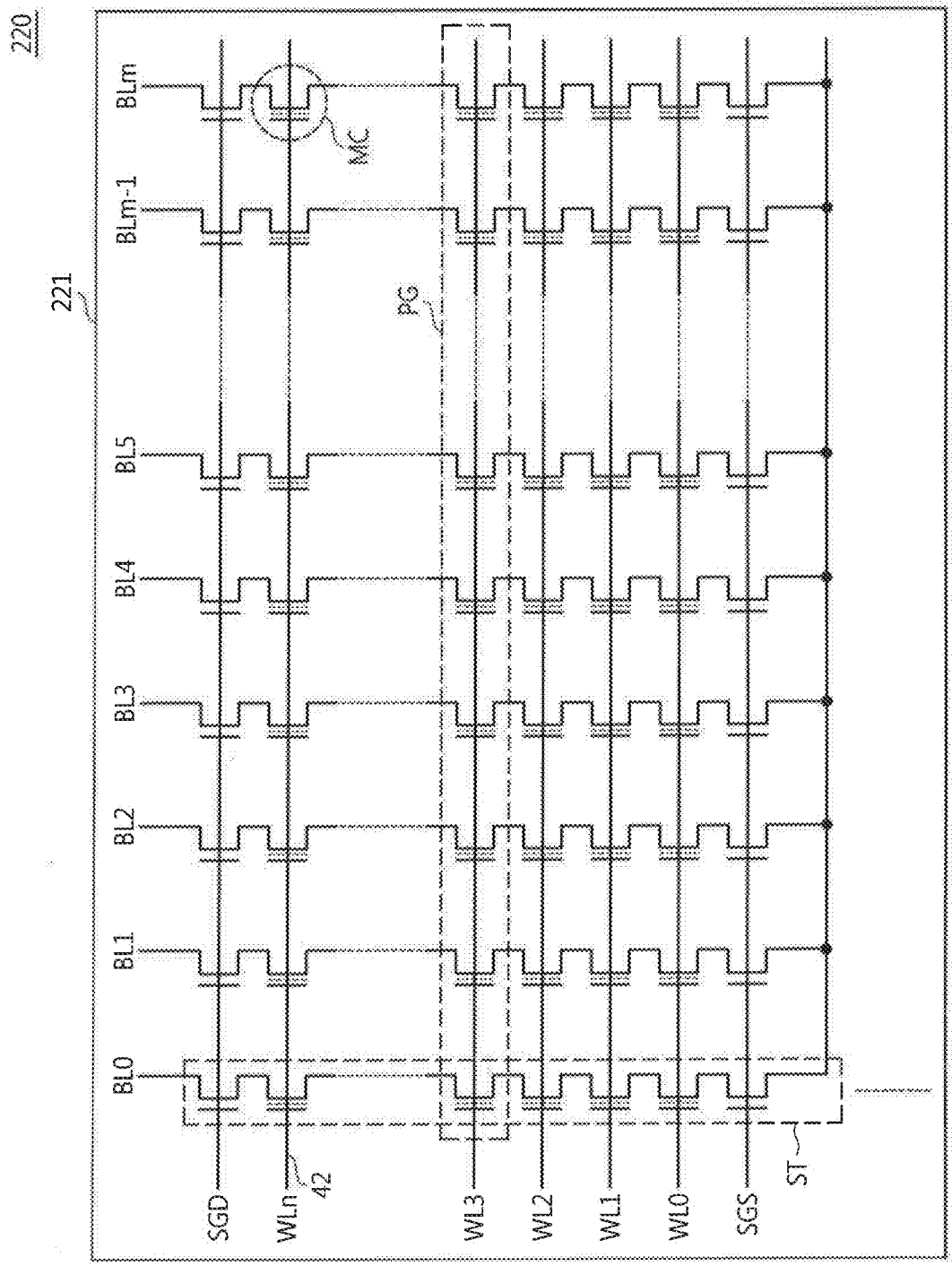
FIG. 2 is a block diagram showing a flash memory device according to an exemplary embodiment of the present inventive concept.
Figure 3:
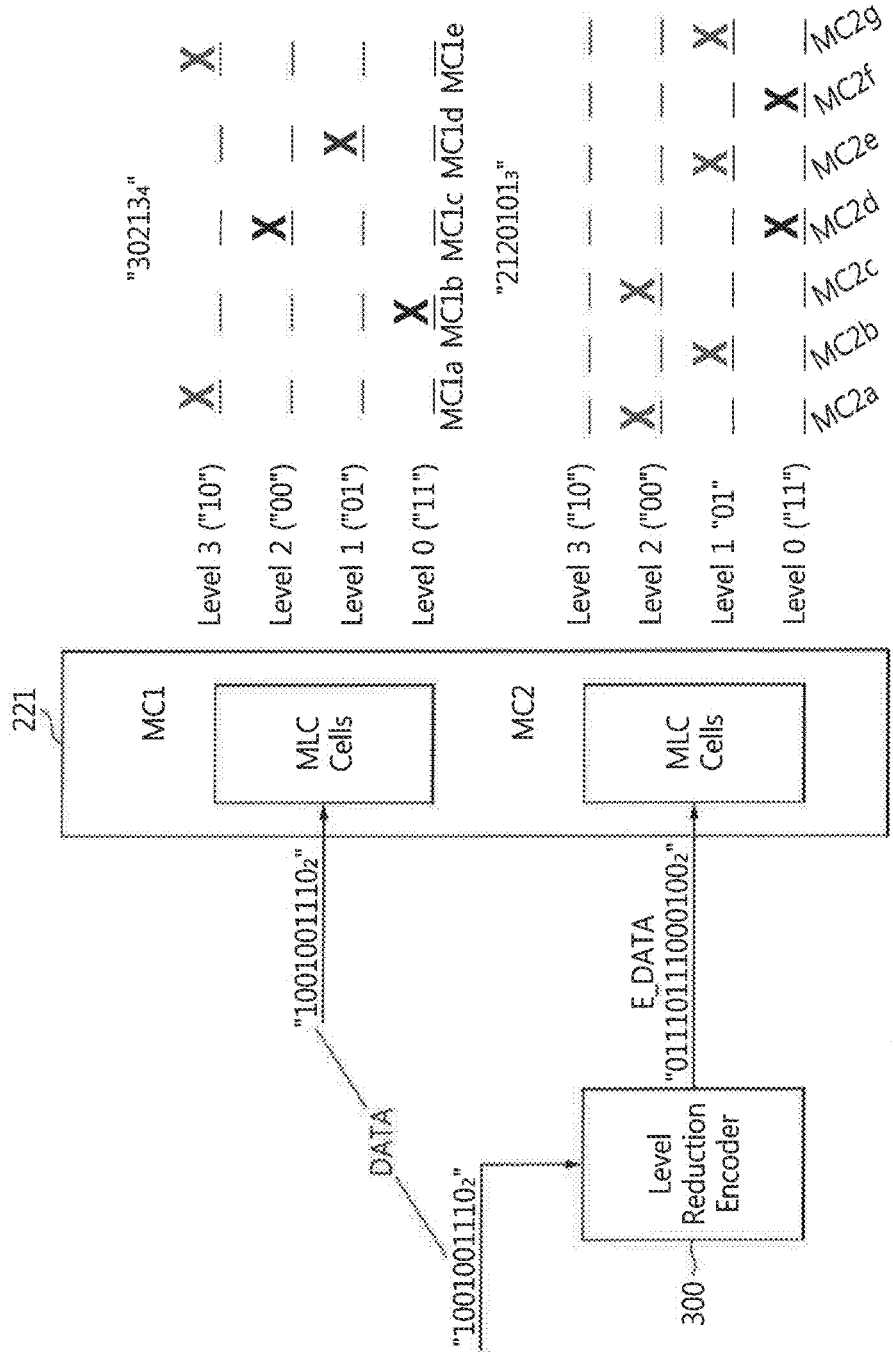
FIG. 3 shows a level reduction algorithm according to an exemplary embodiment of the present inventive concept.

Hereinafter, a memory system using a level reduction algorithm according to an exemplary embodiment will be described with reference to FIGS. 1 to 3. FIG. 1 shows a memory system according to an exemplary embodiment of the present inventive concept. FIG. 2 is a block diagram showing a flash memory device according to an exemplary embodiment of the present inventive concept. FIG. 3 shows a level reduction algorithm according to an exemplary embodiment of the present inventive concept.

In FIG. 1, a memory system 200 includes a controller 210 and a memory 220. The controller 210 includes a host interface 211 and a memory interface 212. The memory system 200 communicates with a host 100 through the host interface 211. The memory 200 operates under the control of the controller 210 through the memory interface 212. For example, the host interface 211 may include Serial ATA (SATA), eSATA, or Peripheral Component Interconnect Express (PCIe).

The controller 210 further includes a processor 213, a read only memory (ROM) 214, and a random access memory (RAM) 215. The ROM 214 may store firmware necessary for the processor 213 to operate the memory system 200. For example, the firmware may include a program code for a level reduction algorithm according to an exemplary embodiment. In addition, the firmware may include program codes for a error correction algorithm and a data compression algorithm. For example, the error correction algorithm may include a BCH code, a Reed-Solomon code, or a low-density parity-check (LDPC) code. The data compression algorithm may include a Huffman code, a Tunstall code, an Arithmetic code, or a Lempel-Ziv code.

The memory 220, in FIG. 2, includes a multi-level cell (MLC) memory including an MLC memory array 221. The MLC memory array 221 includes memory cells MC, bit lines BL0-BLm and word lines WL0-WLn. The memory cells MC are capable of storing at least two-bit information using four or more levels, but at least one level is not used according to a level reduction algorithm of the present inventive concept. For example, when input data is encoded using a level reduction algorithm, the encoded input data does not have at least one level from four or more levels that an MLC has according to the number of bits stored per an MLC. The level reduction algorithm will be described below.

Each row of the memory cells MC may be referred to as a page. The memory cells MC in each row are connected in parallel to one of the word lines WL0-WLn. For example, the memory cells in a page PG are connected in parallel to a word line WL3. One page in an MLC operation corresponds to at least two or more pages in an SLC operation. For example, at least two pages of an SLC operation are programmed in the same cell of the page PG. Alternatively, one page PG may be partitioned such that each partitioned page stores a page of an SLC operation.

Each column of the memory cells MC may be referred to as a string. The memory cells MC in each string are connected in series to each other. One end of each string is connected, to one of bit lines BL0-BLm, and the other end is connected to a common source line SL. For example, one end of a string ST is connected to a bit line BL0 and the other end is connected to the common source line SL. The memory cells in the string ST are programmed or read through the bit line BL0 by activating at least one of the word lines WL0-WLn.

The MLC memory array 221 may be erased at the same time. In this case, the MLC memory array 221 may be referred to as a memory block. For the convenience of description, the MLC memory array 221 includes one memory block. The inventive concept is not limited thereto, and the MLC memory array 221 may include two or more blocks therein. In this case, the blocks may be erased independently of each other.

The memory system 200 may be in the form of a memory card, a solid, state device (SSD), or an embedded memory system.

In FIG. 3, the MLC memory array 221 includes two kinds of MLCs that are capable of storing two-bit information per an MLC using four levels Level 0 to Level 3. The two kinds of the MLCs include a first MLC MC1 and a second MLC MC2. The first MLC MC1 stores input data DATA without using a level reduction algorithm according to an exemplary embodiment. The second MLC MC2 stores input data DATA using a level reduction algorithm according to an exemplary embodiment. Alternatively, the memory 220 may include the second MLC MC2 only in the MLC memory array 221.

For example, if input data DATA of "$1001001110_2$" is stored in the first MLC MC1. The subscript "2" in the input data DATA of "$1001001110_2$" represents the base of a number expressing the input data DATA. In this case, the input data DATA is not encoded by a level reduction encoder 300 which performs a level reduction algorithm according to an exemplary embodiment. Accordingly, the first MLC MC1 stores the input data DATA using the four levels Level 0 to Level 3. The four levels Level 0 to Level 3 are the maximum levels that the first MLC MC1. For example, the input data DATA is distributed over the five first MLCs MC1a to MC1e using the four levels Level 0 to Level 3. Each of the first MLCs MC1a to MC1d stores two-bit information of the input data DATA. For example, the first cell MC1a stores the first rightmost two-bit information '10' of the input data DATA in the third level Level 3; the second cell MC1b stores the second two-bit information '11' of the input data DATA in the zeroth level Level 0; the third cell MC1c stores the third two-bit information '00' of the input data DATA in the second level Level 2; the fourth cell MC1d stores the fourth two-bit information '01' of the input data DATA in the first level Level 1; and the fifth cell MC1e stores the leftmost two-bit information '10' of the input data DATA in the third level Level 3.

Accordingly, without using a level reduction algorithm, the input data DATA is distributed over the first MLC MC1a-MC1e using the four levels Level 0 to Level 3. The first MLC MC1 stores the input data DATA using base four. For example the first MLCs MC1a-MC1e store "$30213_4$". The base represents the number of levels occupied by the input data DATA. Accordingly, if the input data DATA is stored without using a level reduction algorithm, the number of levels occupied corresponds to the maximum number of allowed levels per an MLC.

However, if the same input data DATA of "$1001001110_2$" is stored using a level reduction algorithm in the second MLC MC2, one level of the four possible levels Level 0 to Level 3 is not used. For example, the level reduction encoder 300 converts the input data DATA to encoded input data E_DATA using a level reduction algorithm according to an exemplary embodiment. If FIG. 3, the encoded input data E_DATA does not include the third level Level 3 which is eliminated by the level reduction algorithm, and thus the encoded input data E_DATA is stored in the second MLC MC2a to MC2g using less levels.

The encoded input data E_DATA may be expressed such that one level is not included in the encoded input data E_DATA. For example, the encoded input data E_DATA may correspond to "$01110111000100_2$". The encoded input data E_DATA does not include two-bit information "10"

corresponding to the third level Level 3. For example, the first cell MC2a stores the first rightmost two-bit information "00" of the encoded input data E_DATA in the second level Level 2; the second cell MC2b stores the second two-bit information "01" of the encoded input data E_DATA in the first level Level1; the third cell MC2c stores the third two-bit information "00" of the encoded input data E_DATA in the second level Level 2; the fourth cell MC2d stores the fourth two-bit information "11" of the encoded input data E_DATA in the zeroth level Level 0; the fifth cell MC2e stores the fifth two-bit information "01" of the encoded input data E_DATA in the first level Level 1; the sixth cell MC2f stores the sixth two-bit information "11" of the encoded input data E_DATA in the zeroth level Level 0; the seventh cell MC2g stores the leftmost two-bit information "01" of the encoded input data E_DATA in the first level Level 1.

Accordingly, the second MLC MC2 stores the input data DATA as a number expressed in base three. For example, the second MLCs MC2a to MC2g store "$2120101_3$", in this case, the number of levels used is three and the third level Level 3 is eliminated from the allowed four levels Level 0 to Level 3 for the second MLC MC2. Each digit number represents one of the levels Level 0 to Level 2. The number of levels used is less than the maximum number of allowed levels per an MLC.

As described above, if the level reduction algorithm is set to distribute the input data DATA using only three levels of the four possible levels, the input data DATA is distributed over seven memory cells MC2a-MC2g using three levels Level 0-Level 2.

The bit length of the encoded input data E_DATA is greater than that of the input data DATA according to a level reduction algorithm of the present inventive concept. For example, the bit length of the input data DATA is 10, and the bit length of the encoded input data E_DATA is 14. The relationship between the bit length of the input data DATA and the bit length of the encoded input data E_DATA will be described later.

The input data DATA is assumed to have a binary (or base-two) number of '$1001001110_2$', for example. The input data DATA may be a chunk of an input bit stream. The bit length of the input bit stream may be at least two times the number of cells per a page. The input data DATA corresponds to a chunk of the bit stream which is encoded by the level reduction encoder 300. In the exemplary embodiment described above, the chunk of the input bit stream or the input data DATA corresponds to a 10-bit chunk.

The inventive concept is not limited thereto, and the MLCs MC1 and MC2 may store three or more bits information per an MLC. For example, if the MLCs MC1 and MC2 are capable of storing three-bit information per an MLC, they have eight levels which are distinguished from each other by threshold voltages of the MLCs MC1 and MC2.

Hereinafter, the level reduction algorithm will be described in detail.

A level reduction algorithm eliminates at least one level from possible levels which an MLC has for storing input data DATA. If an MLC stores m-bit information per an MLC, the maximum number of levels in the MLC is two to the power m ($2^m$) which may be referred to L. For the convenience of description, it is assumed that the input data DATA corresponds a P-bit length bit stream. Thus, the level reduction encoder 300 receives the input data DATA of a P-length binary information.

The number of MLCs to store the input data DATA corresponds to P/m that may be referred to as N. Accordingly, if the input data DATA is stored without using the level reduction algorithm, the input data DATA is distributed over P/m MLCs or N MLCs using L levels Level 0 to Level (L-1).

The level reduction encoder 300 converts the input data DATA to encoded input data E_DATA by eliminating at least one level from the L levels. The number of eliminated levels may be referred to K. The size of encoded input data E_DATA is Q. The encoded input data E_DATA is a Q-length binary information. Accordingly, the level reduction encoder 300 converts the P-length input data DATA to the Q-length encoded input data E_DATA so that the Q-length encoded input data E_DATA is distributed using less levels.

The number of MLCs to store the encoded input data E_DATA corresponds to Q/m. Accordingly, if the encoded input data E_DATA is distributed over Q/m MLCs using Level 0 to Level (I-1), wherein I is equal to (L-K) and is the number of levels used to store the encoded input data E_DATA. The levels Level (L-K) to Level (L-1) are eliminated from the possible levels Level 0 to Level (L-1) using the level reduction algorithm.

A conversion ratio P/Q represents a conversion ratio between the input data DATA and the encoded input data E_DATA in light of the binary bit lengths of the P length string and the Q-length string. To apply a level reduction algorithm according to an exemplary embodiment, the conversion ratio P/Q should be lower or equal to the maximum conversion ratio of $\log_L(I)$ as follows:

$$\frac{P}{Q} \leq \lim_{N \to \infty} \frac{\log_2 I^N}{N \cdot \log_2 |\Sigma|} = \frac{\log_2 I}{\log_2 |\Sigma|} = \log_L I, \quad \text{Equation (1)}$$

wherein $|\Sigma|=L$; I, smaller than L, is the number of levels used to store the encoded input data E_DATA; and N is the number of MLCs required to store the input data DATA of which bit length is P.

The maximum conversion ratio of the conversion ratio P/Q is the value of $\log_L(I)$. The value of $I^N$ is the number of combinations that is represented by using I levels among N cells. The value of $N \cdot \log_2 |\Sigma|$ is the number of bits of the input data DATA distributed, using $|\Sigma|$ levels, over N cells.

According to an exemplary embodiment, an input bit stream having a page size may be compressed such that the encoded input data stream is stored in the same page. In this case, additional memory cells are not necessary to store the encoded input data stream. Alternatively, to accommodate the increased size of the encoded input data, the size of a page in the MLC memory array 221 may be increased. The page (or wordline) allocation will be described later with reference to FIGS. 11 and 12.

The level reduction algorithm may be performed by either a tabular coding method or an enumerative coding method. In both methods, the first step is to decide upon the conversion ratio of P/Q according to the number of levels to be used for storing the encoded input data E_DATA.

Figure 4:
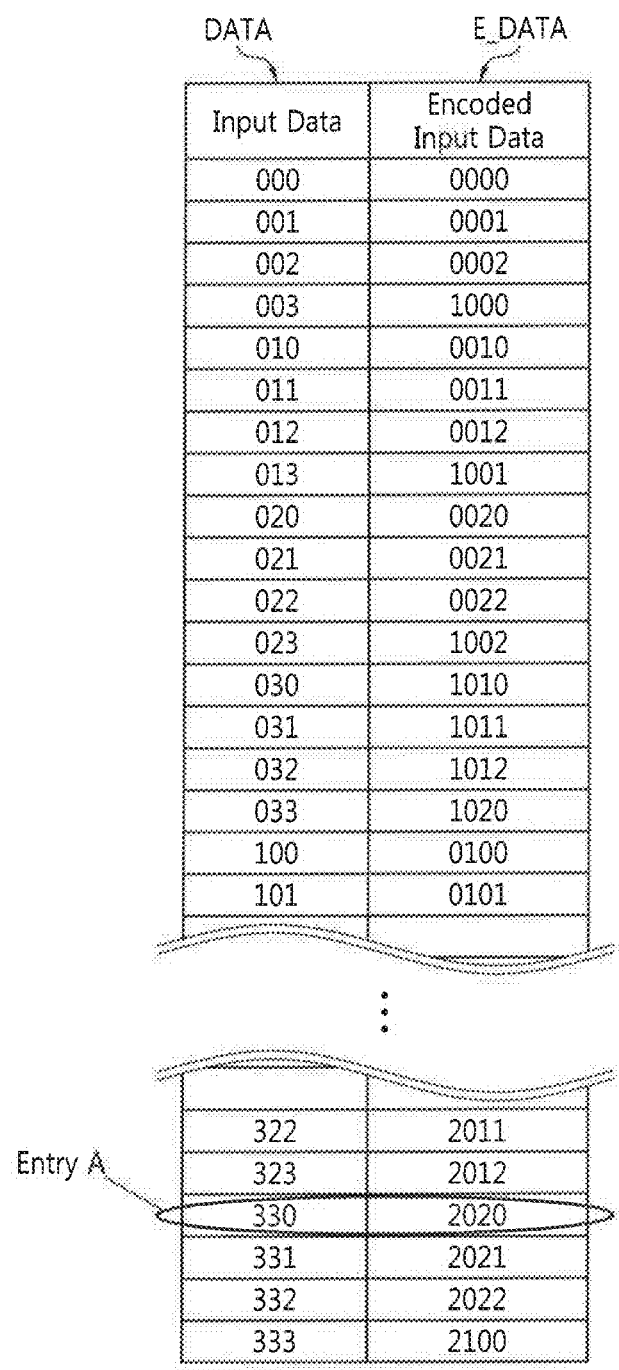

FIGS. 4 and 5 show tables which include a plurality of entries mapping input data DATA to encoded input data E_DATA according to an exemplary tabular encoding method of the present inventive concept. In FIGS. 4 and 5, each entry of a table includes a pair of input data DATA and encoded input data E_DATA The input data DATA corresponds to a P-length string which is expressed using L levels Level 0 to Level (L-1), and the encoded input data E_DATA corresponds to a Q-length string which is expressed using I levels Level 0 to Level (I−1). For example, the input data DATA is expressed using four levels Level 0 to Level 3. Each digit number of the input data DATA represents one of the four levels Level 0 to Level 3. The encoded input data E_DATA is expressed using three levels Level 0 to Level 2 without using the highest level Level 3. Each digit number of the encoded input data E_DATA represents one of the three levels Level 0 to Level 2.

In FIG. 4, the input data DATA is mapped to its corresponding encoded input data E_DATA in an one-to-one relationship.

In operation, the level reduction encoder 300 of FIG. 3 receives input data DATA, and searches the encoded input data E_DATA corresponding to the input data DATA by performing a matching operation using, for example, one of the tables FIGS. 4 and 5, and generates the encoded input data E_DATA to be stored in the memory 220.

For a read operation, the encoded input data E_DATA stored in the memory 220 may be decoded using a decoding operation that is done the same way in reverse. Such read operation is performed using smaller number of reference voltages than required if a read operation is performed without using a level reduction algorithm.

In FIG. 4, the table shows an exemplary one-to-one mapping relationship for an MLC that is capable of two-bit information per an MLC. The number of levels is reduced from 4 to 3 according to an exemplary embodiment. In this case, the maximum conversion ratio is $\log_4 3$ (=0.79). The conversion ratio of P/Q is 6/8(=0.75), where the P is the binary bit size of the input data DATA shown in the left column, and the Q is the binary bit size of the encoded input data E_DATA shown in the right column. Each digit number of the input data DATA and the encoded input data E_DATA represents a level corresponding to two-bit information. The conversion ratio of P/Q is less than the maximum conversion ratio.

A level reduction algorithm is applied if the conversion ratio of P/Q is equal to or less than the maximum conversion ratio according to the equation Equation (1). In FIG. 4, the conversion ratio of P/Q (=0.75) is less than the maximum conversion ratio (=0.79). Accordingly, the level reduction algorithm applies to the input data DATA, generating the encoded input data E_DATA.

The input data DATA is expressed as a number in base four of which each digit number represents one of the four levels Level 0 to Level 3. In this case, the input data DATA is expressed as one of $4^3$ combinations in the table. The encoded input data E_DATA is expressed as a number in base three of which each digit number represents one of three levels Level 0 to Level 2. In formulating the table, the encoded input data E_DATA without having the third level Level 3 is assigned to its corresponding input data DATA. For example, for Entry A of FIG. 4, the input data DATA is expressed as "$330_4$", and its corresponding encoded input data E_DATA is expressed as "$2020_3$". The encoded input data E_DATA is expressed only using three levels Level 0 to Level 2 without using the third level Level 3.

The inventive concept is not limited to the table of FIG. 4. For example, according to an exemplary embodiment, the one-to-one relationship may be randomly assigned so that the third level Level 3 is not assigned to the encoded input data E_DATA in many ways, and thus the table of FIG. 4 includes different one-to-one relationship as shown in FIG. 4.

For the convenience of description, the reduction from four levels to three levels has been described above. The inventive concept is not limited thereto. For example, reduction of four levels to two levels is possible according to a level reduction algorithm as long as the conversion ratio of P/Q is equal to or less than the maximum conversion ratio of $\log_4 2$. In this case, the conversion ratio of P/Q corresponds to 1/2.

In FIG. 5, the table shows an exemplary one-to-one mapping relationship for an MLC that is capable of storing three-bit information per an MLC. The number of levels is reduced from 8 to 4 according to an exemplary embodiment. In this case, the maximum conversion ratio is a value of $\log_8 4$ (=0.66) according to the equation Equation (1) as described above. The conversion ratio of P/Q is 4/6(=0.66), where the P is the binary bit size of input data DATA shown in the left column, and the Q is the binary bit size of encoded input data E_DATA shown in the right column. A digit number of each place in the input data DATA and the encoded input data E_DATA represents a level. A level reduction algorithm is applied if the conversion ratio of P/Q is equal to or less than the maximum conversion ratio. In this case, the conversion ratio of P/Q is equal to the maximum conversion ratio. Accordingly, the level reduction algorithm applies to the input data DATA, generating the encoded input data E_DATA.

The input data DATA is expressed as a number in base 8 of which each digit number represents one of the eight levels Level 0 to Level 7. In this case, the input data DATA is expressed as one of a combination of $7^2$ in the table. The encoded input data E_DATA is expressed as a number in base four of which each digit number represents one of the four levels Level 0 to Level 3. In formulating the table, the encoded input data E_DATA is expressed in a number without having four levels Level 4 to Level 7. The encoded input data E_DATA is assigned to its corresponding input data DATA. For example, for Entry B of FIG. 5, the input data. DATA is expressed as "$74_8$", and its corresponding encoded input data E_DATA is expressed as "$330_4$". The encoded input data E_DATA is expressed only using four levels Level 0 to Level 3 without using the levels Level 4 to Level 7. The input data DATA of "$74_8$" is stored in two MLCs, and the encoded input data E_DATA of "$330_4$" is stored in three MLCs.

According to an exemplary embodiment, the one-to-one relationship is randomly assigned such that the four levels Level 4 to Level 7 are not assigned to the encoded input data E_DATA and thus such one-to-one relationship may be formulated in various manners.

For the convenience of description, the reduction from eight levels to four levels has been described above. The inventive concept is not limited there to. For example, reduction of eight levels to two levels is possible if the equation Equation (1) is met. In this case, the maximum conversion ratio is $\log_8 2$ (=0.33). If the conversion ratio of P/Q corresponds to 1/3 (=0.33), the equation Equation (1) is satisfied. For example, reduction of eight levels to three levels is possible if the equation Equation (1) is satisfied. In this case, the maximum conversion ratio is log 83 (=0.52). If the conversion ratio of P/Q corresponds to 1/2, the equation. Equation (1) is satisfied.

According to an exemplary embodiment, a tabular encoding table includes LP entries therein.

Figure 6:
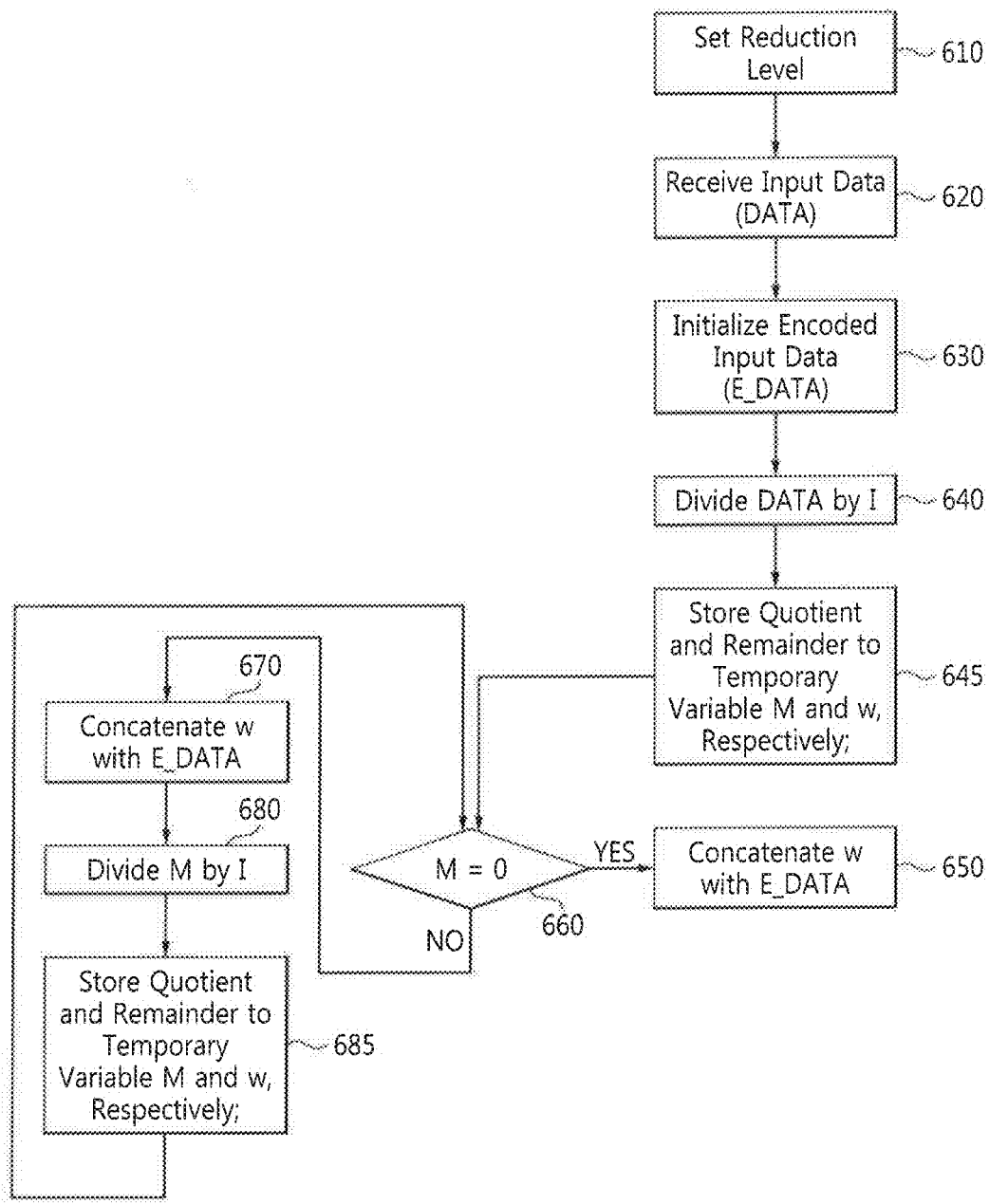
FIG. 6 shows a flowchart showing an enumerative encoding method according to an exemplary embodiment of the present inventive concept.
Figure 7:
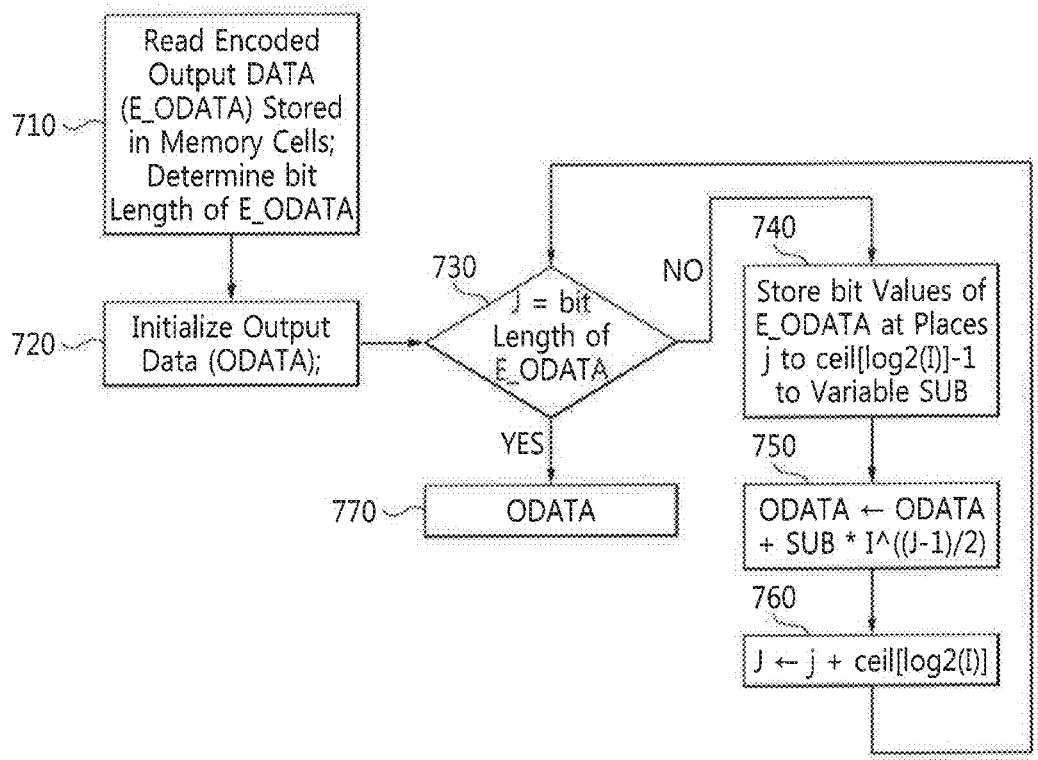
FIG. 7 shows a flowchart showing an enumerative decoding method according to an exemplary embodiment of the present inventive concept.

Hereinafter, an enumerative encoding/decoding method is described with reference to FIGS. 6 and 7. FIG. 6 shows a flowchart showing an enumerative encoding method according to an exemplary embodiment of the present inventive concept. FIG. 7 shows a flowchart showing an enumerative decoding method according to an exemplary embodiment of the present inventive concept. For the convenience of description, each step of FIGS. 6 and 7 will be described with reference to FIG. 3.

An enumerative encoding method implements a level reduction algorithm using a base conversion from a P-length string expressed as a number in base L to a Q-length string expressed as a number in base I. The P-length string corresponds to input data DATA, and the Q-length string corresponds to encoded input data E_DATA. The conversion is performed iteratively, in the first iteration the input data DATA is divided by I. The remainder is the first encoded digit. The integer quotient is input to the next iteration of which the resulting remainder is concatenated to the left of the first encoded digit. The iteration process repeats until the integer quotient is equal to zero. The decoding process converts bases in the opposite direction. The conversion is performed by multiplying each digit of base I in place j by I to the power j ($I^j$), wherein j represents a place in the base I.

In step 610, the number of eliminated levels is set. The number of data bits to be stored in an MLC may also be set. For example, in FIG. 3, the MLCs MC1 and, MC2 are capable of storing two-bit information per an MLC, and the number of levels to be eliminated is 1. The exemplary level reduction of FIG. 3 corresponds to reduction from four levels to three levels. For example, L is four and I is three. The maximum conversion ratio is 0.79 according to the equation Equation (1). In this case, the conversion ratio of P/Q is allowable if less than or equal to 0.79. In FIG. 3, the conversion ratio of P/Q is 10/14 (=0.71).

In step 620, the input data DATA is received. For example, the input data DATA is '$1001001110_2$'. The bit length P of the input data DATA is ten.

In step 630, encoded input data E_DATA is initialized. The size of the encoded input data E_DATA is fourteen to store the encoded input data E_DATA according to the equation Equation (1) as described above.

In step 640, the input data DATA is divided by I. I is the number of allowed levels for an MLC according to the number of eliminated levels in step 610. The division operation is applied to a decimal number of the input data DATA. For example, the input data DATA is '$1001001110_2$', and its decimal number $590_{10}$. In the first division operation, its quotient is 196, and the remainder is 2.

In step 645, the quotient and remainder are temporarily stored in variables M and w, respectively.

In step 660, it is determined whether the quotient stored in the variable M is equal to zero. If the quotient is not zero, the level reduction algorithm proceeds to step 670 where the temporary variable w is concatenated with the encoded input data E_DATA. For example, the quotient M is $590_{10}$, and thus the level reduction algorithm proceeds to step 670 where the encoded input data E_DATA stores the value of $2_3$.

In step 680 the value of the variable M is divided by I.

In step 685, the variables M and w are updated with the quotient and the remainder calculated in step 680, respectively.

The steps 660, 670, 680 and 685 are iterated until the value of the temporary variable M is equal to zero. The remainder generated in each iteration is concatenated with the encoded input data E_DATA Accordingly, the input data DATA is converted into the encoded input data E_DATA which is expressed as a number in base I. Each digit number of the E_DATA represents its corresponding two-bit information of the encoded input data E_DATA.

The decoding process converts bases in the opposite direction as shown in FIG. 7.

In step 710, encoded output data E_ODATA stored in the second MLC MC2 is read. The encoded output data E_ODATA corresponds to the encoded input data E_DATA. The encoded output data E_ODATA expressed as a number in base I is read in a binary number.

In step 720, output data ODATA is initialized. The output data ODATA stores a number which is decoded from the encoded output data E_ODATA. The decoded number is equal to a number of the input data DATA.

Steps 730 to 760 are iterated until an iteration number j reaches the maximum of the binary bit length of the encoded output data E_ODATA. The number of iteration is counted using an iteration number j. The iteration number j represents a place of the encoded output data E_ODATA. The iteration number j increases, in step 760, by a value of ceil[$\log_2(i)$] which corresponds to the least integer that is greater than or equal to $\log_2(I)$. As described above, I represents the number of allowed levels according to a level reduction algorithm, and the value of ceil[$\log_2(I)$] corresponds to the maximum number of levels allowed in the second MLC MC2. For example, if the second MLC MC2 stores two-bit information per an MLC, the value of ceil[$\log_2(I)$] is 2.

In step 740, bit values of the encoded output data E, . . . ODATA positioned at places j to ceil[$\log_2(I)-1$] are stored in a temporary variable SUB.

In step 750, the temporary variable SUB is multiplied, by a place value of $I^{((j-1)/2)}$ for an I-base number representing encoded output data E_ODATA. For reduction of four levels to three levels as shown in FIG. 3, the second MLC MC2 stores a base-3 number, and the place values of $I^{(j-1)/2}$ include $3^0, 3^1, 3^2 \ldots 3^6$.

In step 730, if the iteration number j reaches the maximum number of the bit length of the encoded output data E_ODATA, the enumerative decoding process ends in step 770. The value of ODATA corresponds to that of the input data DATA in a decimal number.

Hereinafter it will be described that a read operation is performed on a multi-level cell which is programmed using a level reduction algorithm according to an exemplary embodiment of the present inventive concept. FIG. 8 shows a level reduction table showing a single reference comparison for reading each single page stored in multi-level cells.

For the convenience of description, each memory cell is capable of storing two bit information using four levels per a memory cell. Input data DATA is represented using two bit information in the first and second column Page-1 and Page-2. The two-bit information Page-1 and Page-2 are encoded according to an exemplary level reduction algorithm as encoded input data E_DATA shown in the third column. Such encoded input data may be assigned to two-bit information Page-1 and Page-2 so that each page is read using a single reference comparison using Ref-1 and Ref-2.

The matching relationship between the two bit information, the encoded data, and combination of reference voltages Ref-1 and Ref-2 is not limited to the table of FIG. 8, and thus the matching relationship thereof may be formulated in various manners.

For the convenience of description, it is assumed that the maximum conversion ratio is below or equal 0.792, and a level-reduction algorithm is applied using the conversion ratio of P/Q (3/4). Accordingly, the encoded data E_DATA of the two bit information is distributed over four cells using three levels. The comparison results using two single references Ref-1 and Ref-2 represent comparison results of each memory cell.

Ref-1 comparison may refer to comparison using a reference voltage Ref-1 to distinguish between Level 0 and Level 1 as shown in FIG. 3. The Ref-1 comparison may have two results of "0" and "+". The "0" mark may refer to Level 0, and the "+" mark may refer to Level 1 or Level 2.

Ref-2 comparison may refer to comparison using a reference voltage Ref-2 to distinguish between Level 1 and Level 2 as shown in FIG. 3. Accordingly, the Refe-2 comparison may have two results "2" or "−". The "2" mark may refer to Level 2, and the "−" mark may refer to Level 0 or Level 1.

In a single reference comparison method according to an exemplary embodiment, each page of the two pages Page-1 and Page-2 may be uniquely read by applying a single reference comparison using one of two reference voltages Ref-1 and Ref-2 to the four cells storing the encoded data E_DATA.

For example, the first page Page-1 may be uniquely decoded with the first reference voltage Ref-1 only without further using the second reference voltage Ref-2. For example, the first page Page-1 may have "000" if four Ref-1 comparison results of the four cells have "+++0". The first page Page-1 may have "010" if four Ref-1 comparison results have "+0++". Accordingly, bit information of the first page Page-1 may be uniquely associated with comparison results using the first reference voltage Ref-1 only.

For example, the second page Page-2 may be uniquely read with a single reference comparison using a second reference voltage Ref-2 without further comparison using Ref-1 except for the comparison result of "−−−−". For example, the second page Page-2 may have "001" if four Ref-2 comparison results have "222−". The second page Page-2 may have "111" if the four Ref-2 comparison results have "+0++". Accordingly, bit information of the second page Page-2 may be uniquely associated with comparison results using the second reference voltage Ref-2 only. However, the comparison result of "−−−−" is associated with more than one information of the second page Page-2. For example, "000" "011", "101." and "111" of the second page Page-2 have the same comparison result of "−−−−". Accordingly an additional comparison using the first reference voltage Ref-1 is necessary to select one of the multiple information of the second page Page-2.

The inventive concept may be applied to the 8-level MLC. For example, a table may be formed by concatenating distinctive 4-levels as shown in FIG. 8.

According to an exemplary embodiment, a read operation may be accelerated by distributing the data so that each page can be read using a single reference comparison.

Figure 9:
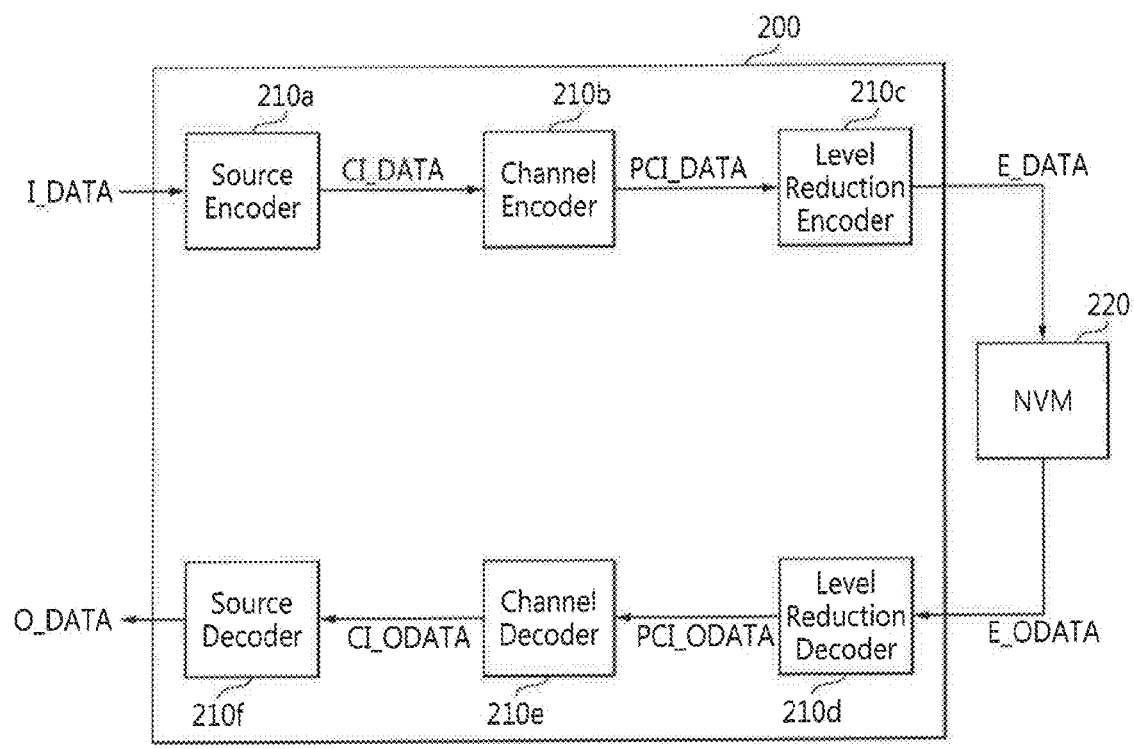
FIG. 9 shows the memory system of FIG. 1 according to an exemplary embodiment of the present inventive concept.
Figure 10:
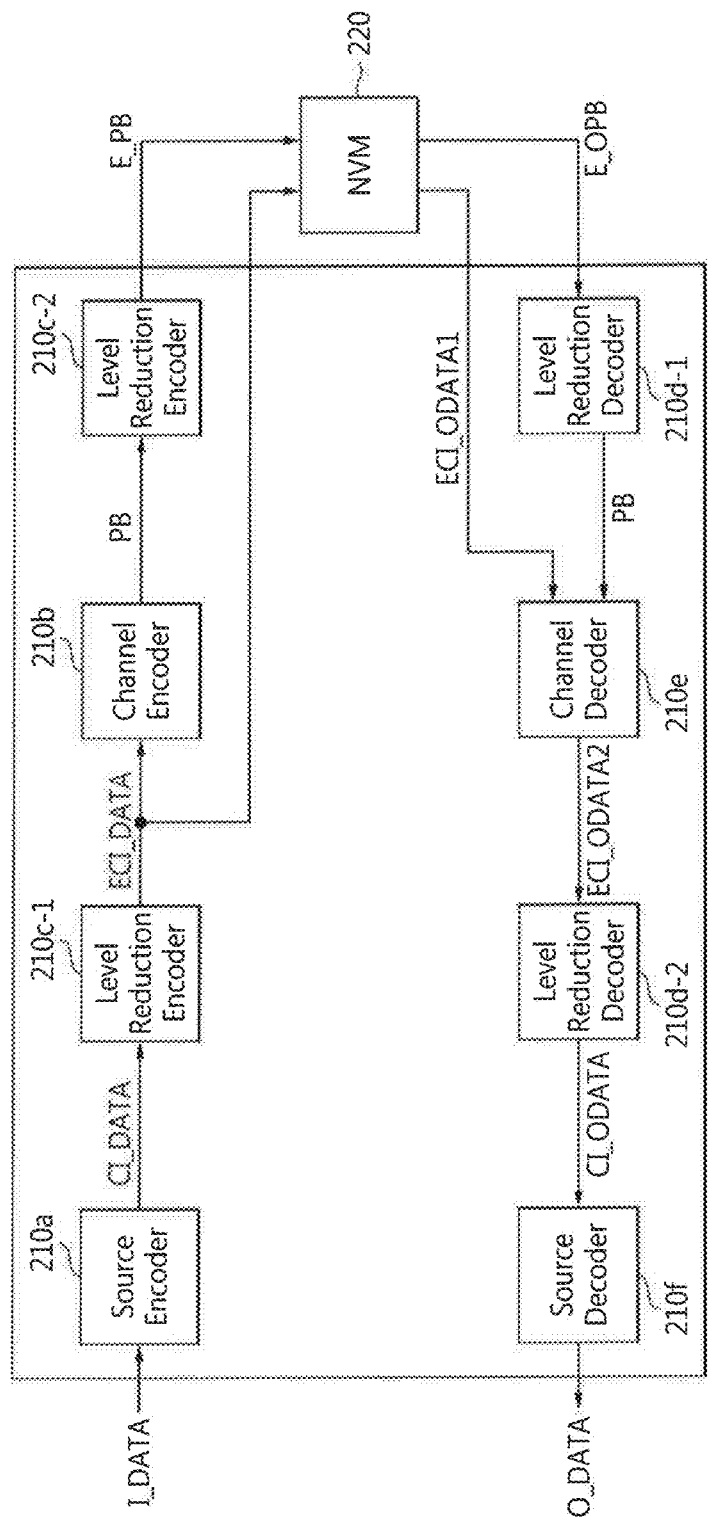
FIG. 10 shows the memory system of FIG. 1 according to an exemplary embodiment of the present inventive concept.

Hereinafter, the memory system 200 will be described with reference to FIGS. 9 and 10. FIG. 9 shows the memory system 200 of FIG. 1 including a level reduction encoder and a level reduction decoder according to an exemplary embodiment. FIG. 10 shows the memory system 200 of FIG. 1 including level reduction encoders 210*c*-1 and 210*c*-2 and level reduction decoders 210*d*-1 and 210*d*-2 according to an exemplary embodiment of the present inventive concept.

In FIG. 9, the memory system 200 of FIG. 1 includes a level reduction encoder and a level reduction decoder according to an exemplary embodiment. The memory system 200 includes a source encoder 210*a*, a channel encoder 210*b* and a level reduction encoder 210*c* for an encoding operation using a level reduction algorithm according to an exemplary embodiment.

The source encoder 210*a* serves to compress an input bit stream I_DATA and generate a compressed input bit stream CI_DATA. The compression may be performed using at least one of compression algorithms such as a Huffman code, a Tunstall code, an Arithmetic code, a Lempel-Ziv, or a Dynamic Markov Chain. The bit length of the input bit stream I_DATA is reduced by compression.

The channel encoder 210*h* serves to perform an error correction algorithm, using parity bits, on the compressed input bit stream CI_DATA to generate a channel encoder output PCI_DATA. The error correction algorithm may be performed using at least one of error correction algorithms such as a BCH code, a Reed-Solomon code, an LDPC code, a Convolutional code, a Product code.

The level reduction encoder 210*c* performs a level reduction algorithm on input data DATA according to an exemplary embodiment. The level reduction encoder 210*c* receives the channel encoder output PCI_DATA and performs a level reduction algorithm on the channel encoder output PCI_DATA. As described in FIG. 3, the level reduction encoder 210*c* receives the channel encoder output PCI_DATA in a chunk of input data DATA. The input data DATA is converted to encoded input data E_DATA according to the level reduction algorithm. The bit length P of the input data DATA and the bit length Q of the encoded output data E_DATA are set to satisfy the equation Equation (1) as described above. The encoded input data E_DATA is distributed over only I levels of L levels. If the eliminated levels correspond to levels at the end of a programming sequence, the programming steps will be simplified and thus programming timing is reduced.

The level reduction encoder 210*c* may be implemented using the tabular encoding method or the enumerative encoding method described above.

The level reduction encoder 210*c* may be implemented using logic gates. Alternatively, the level reduction encoder may be implemented in a computer program.

The memory system 200 further includes a level reduction decoder 210*d*, a channel decoder 210*e* and a source decoder 210*f* for a decoding operation of the level reduction algorithm according to an exemplary embodiment. The level reduction decoder 210*d* performs a decoding operation on encoded output data E_ODATA using a decoding method as described above. The encoded output data E_ODATA is stored in the memory 220. Accordingly the level reduction decoder 210*d* generates the channel encoder output PCI_ODATA which corresponds to the channel encoder input PCI_DATA.

For example, such decoding method may be performed using the tabular encoding tables of FIGS. 4 and 5, or the enumerative decoding method of FIG. 7. The channel decoder 210*e* removes the parity bits and generates the compressed output data CI_ODATA which corresponds to the compressed input data CI_DATA. The source decoder 210*f* uncompresses the compressed output data CI_ODATA and generates an output bit stream O_DATA which corresponds to the input bit stream I_DATA.

According to an exemplary embodiment, the memory system 200 reduces operation time in programming and reading data by using less levels.

In FIG. 10, the memory system 200 of FIG. 1 includes level reduction encoders 210*c*-1 and 210*c*-2 and level reduction decoders 210*d*-1 and 210*d*-2 according to an exemplary embodiment of the present inventive concept. The memory system 200 of FIG. 10 is similar to that of FIG. 8, except that a level reduction algorithm is separately performed on an input bit stream I_DATA and parity bits of the channel encoder. The parity bits are generated based on an encoded number according to a level reduction algorithm of the present inventive concept.

The memory system 200 includes a source encoder 210a, a channel encoder 210b, a first level reduction encoder 210c-1 and a second level reduction encoder 210c-2 for an encoding operation according to an exemplary embodiment. The first level reduction encoder 210c-1 may be implemented to operate the tabular encoding method of FIGS. 4 and 5 or the enumerative encoding method of FIG. 6. The second level reduction encoder 210c-2 may be implemented to operate the tabular encoding method or the enumerative encoding method.

The source encoder 210a and the channel encoder 210b are substantially the same as those of FIG. 9. For the convenience of description, the descriptions of the source encoder 210a and the channel encoder 210b will be omitted.

The first level reduction encoder 230a receives compressed input data CI_DATA from the source encoder 210a and generates encoded compressed input data ECI_DATA. The channel encoder 210b receives the encoded compressed input data ECI_DATA and generates parity bits PB. The second level reduction encoder 210c-2 receives the parity bits PB from the channel encoder 210b and generates encoded parity bits E_PB. The encoded compressed input data ECI_DATA and the encoded parity bits are stored in the memory 220.

The first and second level reduction encoders 210c-1 and 210c-2 perform a level reduction algorithm on the compressed input data CI_DATA and the parity bits PB in a unit of the input data DATA. In an exemplary embodiment, the first and second level reduction encoders 210c-1 and 210c-2 may have different units of the input data DATA.

The encoded compressed input data ECI_DATA and the encoded parity bits E_PB are stored in the same page of the memory 220.

The memory system 200 further includes a first level reduction decoder 210d-1, a second level reduction decoder 210d-2, a channel decoder 210e and a source decoder 210f for a decoding operation of the level reduction algorithm. The channel decoder 210e and the source decoder 210f of FIG. 9 are substantially similar to those of FIG. 8. For the convenience of description, description of the channel decoder 210e and the source decoder 210f will be omitted.

The first level reduction decoder 210d4 receives the encoded parity bits E_PB from the memory device 220, and generates the parity bits PB using a level decoding algorithm according to an exemplary embodiment. The channel decoder 210e receives two information: (1) first encoded compressed output data ECI_ODATA1; and (2) the parity bits PB, and generates second encoded compressed output data ECI_ODATA2 which corresponds to the encoded compressed input data ECI_DATA. The channel decoder 210e receiving separately the parity bits PB may reduce recovery errors when operating associated with the level reduction algorithm according to an exemplary embodiment.

The second level reduction decoder 210d-2 receives the second encoded compressed output data ECI_ODATA2 and generates compressed output data CI_ODATA according to a decoding method of the level reduction algorithm. The compressed output data CI_ODATA corresponds to the compressed input data CI_DATA.

The source decoder 210f uncompresses the compressed input data CI_DATA and generates an output data stream O_DATA which corresponds to the input data stream I_DATA.

Figure 11:
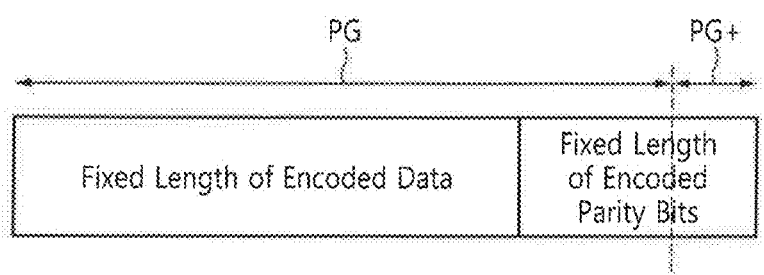
FIG. 11 shows wordline segmentation using additional memory cells to accommodate the increased number of memory cells to store encoded input data according to an exemplary embodiment of the present inventive concept.
Figure 12:
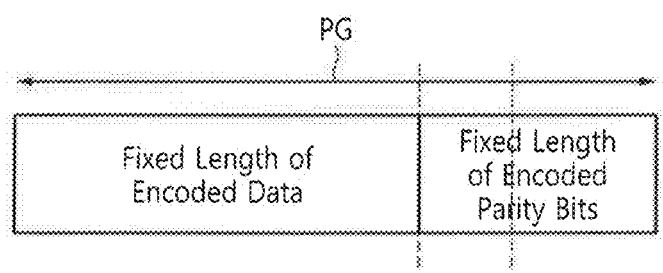
FIG. 12 shows wordline segmentation without using additional memory cells according to an exemplary embodiment of the present inventive concept.

Hereinafter, wordline segmentation will be described with reference to FIGS. 11 and 12 according to an exemplary embodiment of the present inventive concept. FIG. 11 shows wordline segmentation using additional memory cells to accommodate the increased number of memory cells to store encoded input data according to an exemplary embodiment. FIG. 12 shows wordline segmentation without using additional memory cells.

The wordline segmentation may be applied when parity bits are separately encoded using a level reduction algorithm as shown in FIG. 10. The wordline may refers to the page of FIG. 2. The length of each page which is the number of memory cells attached to a wordline is fixed. As described above, data and parity bits are distributed in each page using fewer levels using more memory cells than would have been used without a level reduction algorithm. To store the encoded data and parity bits, two ways of wordline segmentation may be used.

In FIG. 11, each word line including additional memory cells is segmented to accommodate the increased number of memory cells to store encoded input data according to an exemplary embodiment. In FIG. 9(A), the length of each page PG is not enough to store encoded input data ECI_DATA and encoded parity bits E_PB according to an exemplary level reduction algorithm. Accordingly, additional memory cells PG+ are added to each page PG to store the encoded input data ECI_DATA and the encoded parity bits E_PB. For example, a predetermined length of each page PG is allocated to the encoded input data ECI_DATA, and the remaining of each page PG and the addition memory cell PG+ are allocated to the encoded parity bits E_PB. The number of the additional memory cells depends on the conversion ratio of P/Q.

In FIG. 12, each wordline is segmented without using additional memory cells. The encoded input data ECI_DATA and the encoded parity bits E_PB are distributed over a page without using additional memory cells. In this case, smaller conversion ratio of P/Q is used so that the encoded input data ECI_DATA is stored using less memory cells than using higher conversion ratio P/Q, and the encoded parity bits E_PB are stored in each page PG without using additional memory cells.

FIG. 13 shows a table showing an exemplary one-to-one mapping relationship for an MLC which stores multiple pages in a page-by-page manner using higher levels according to an exemplary embodiment of the present inventive concept. In FIG. 13 each row of the table includes one-to-one relationship between input data DATA and its encoded input data E_DATA according to a level reduction algorithm. For the convenience of description, input data DATA include two pages. For example, the first column represents first data of a first page, and the second column represents second data of a second page. The third column represents first encoded input data E_DATA1 for the first data. The input data E_DATA of the first data is distributed in four cells using lower two levels of Level 0 and Level 1. The fourth column represents second encoded data E_DATA2 for the first and the second data. The second encoded data E_DATA2 is formed by adding an additional higher level of Level 2 than the lower two levels Level 0 and Level 1. Each row further includes the fifth column which represents a read voltage to read the encoded data E_DATA1 and E_DATA2.

When adding a second page to a first page, an encoded level of at least one cell of the first page is shifted to higher level. As shown in row A, the first page of "001" is encoded to "0010" using four MLCs. When the second page of "000" is added to the first page, the level of the fourth cell is shifted from Level 0 to Level 1 so that the encoded level of the first and second pages become "0011".

As shown in row B, the first page of "011" is encoded to "0110" using four MLCs. When the second page of "010" is added to the first page, the level of the third cell is shifted from Level 1 to Level 2 and the level of the fourth cell is shifted from Level 0 to Level 1 so that the encoded level of the first and second pages become "0121".

As shown in row C, the first page of "110" is encoded to "1100" using four cells. When the second page of "010" is added to the first page, the level of the first cell is shifted from Level 1 to Level 2, the level of the second cell is shifted from Level 1 to Level 2, and the fourth cell is shifted from Level 0 to Level 2 so that the encoded level of the first and second pages become "2202".

This page-by-page programming using a level reduction algorithm is performed using the characteristics that the level of an MLC is shifted in one way in programming that MLC from the lowest level to the highest level. Compared to the tables of FIGS. 4 and 5, each page may be separately read when a level reduction algorithm is performed using the table of FIG. 13.

According to an exemplary embodiment, a memory system reduces operation time in programming and reading data by using less levels.

According to an exemplary embodiment, a memory system decreases a page error while a level reduction algorithm is used according to an exemplary embodiment. For example, the page error rate may be smaller in the memory system 200 of FIG. 10 than that of FIG. 9. In FIG. 9, the level reduction decoding is applied to the combined data of the input data DATA and the parity bits PB. In this case, the error due to the level reduction decoding may span over the input data DATA and the parity bits PB. However, in FIG. 10, the level reduction decoding is applied to the parity bits only, because the parity bits are already calculated on the encoded input data E_DATA. For example, the channel encoder 210b receives the encoded input data ECI_DATA, and generates the parity bits PB. In this case, the error due to the level reduction algorithm may affect only to the parity bits PB.

According to an exemplary embodiment, the number of reference comparisons performed in a read operation is reduced. For example, if a read operation is performed on an MLC having L levels and if a level reduction algorithm is not applied, the number of reference comparisons is (L−1). However, if a level reduction algorithm is applied and if only I levels which is smaller than L levels are used, the number of reference comparisons is shortened to (I−1). A read operation, according to an exemplary embodiment, operates faster and consumes less power.

What is claimed is:

1. A method of operating a memory device including a plurality of multi-level memory cells of which each multi-level memory cell includes L levels, comprising:
   receiving data which is expressed in a binary number;
   generating a P-length string from the data;
   converting the P-length string to a Q-length string by eliminating at least one level from the L levels, wherein P and Q represent binary bit lengths of the P-length string and the Q-length string, wherein Q is greater than P and wherein L represents a maximum number of levels which each multi-level memory cell has; and
   programming the Q-length string into the plurality of multi-level memory cells,
   wherein the Q-length string is distributed using I levels,
   wherein I is smaller than L, and
   wherein P/Q is equal to or smaller than $\log_L I$.

2. The method of claim 1,
   wherein the converting of the P-length string to the Q-length string is performed using a table including information of a plurality of one-to-one mapping relationships between the P-length string and the Q-length string.

3. The method of claim 1,
   wherein the converting of the P-length string to the Q-length string includes converting the P-length string expressed in a number of a base L to the Q-length string expressed in a number of a base I using a base conversion from the base L to the base I.

4. The method of claim 1, further comprising:
   reading the Q-length string from the plurality of multi-level memory cells using (I−1) reference voltages; and
   decoding the Q-length string to the P-length string.

5. The method of claim 4,
   wherein, the decoding of the Q-Length string is performed using a table including information of one-to-one mapping relationships between the P-length string and the Q-length string.

6. The method of claim 5,
   wherein the decoding of the Q-length string includes converting the Q-length string expressed in a number of a base L to the P-length string expressed in a number of a base I using a base conversion from the base I to the base L.

7. The method of claim 1,
   wherein the generating of the P-length string comprises:
   compressing the data to a compressed data; and
   encoding the compressed data by associating parity bits for the compressed data to generate the P-length string,
   wherein the converting of the P-length string to the Q-length string is performed after the encoding of the compressed data.

8. The method of claim 1,
   wherein the generating of the P-length string comprises:
   compressing the data to a compressed data, and
   further comprising:
   generating an X-length parity bit based on the Q-length string;
   encoding the X-length parity bit to a Y-length parity bit, wherein Y is greater than X, and wherein the Y-length parity bit is distributed over the I levels.

9. The method of claim 8, further comprising:
   programming the Y-length parity bit into the plurality of multi-level memory cells.

* * * * *